(12) United States Patent
Yoshikawa et al.

(10) Patent No.: US 12,512,243 B2
(45) Date of Patent: Dec. 30, 2025

(54) SUPERCONDUCTING COIL DEVICE

(71) Applicants: JEOL Ltd., Tokyo (JP); RIKEN, Saitama (JP); SUMITOMO ELECTRIC INDUSTRIES, LTD., Osaka (JP)

(72) Inventors: Masatoshi Yoshikawa, Kobe (JP); Yasuyuki Miyoshi, Kobe (JP); Mamoru Hamada, Kobe (JP); Kazuyoshi Saito, Kobe (JP); Yoshinori Yanagisawa, Wako (JP); Renzhong Piao, Wako (JP); Kotaro Ohki, Osaka (JP); Takashi Yamaguchi, Osaka (JP); Tatsuoki Nagaishi, Osaka (JP)

(73) Assignees: JEOL Ltd., Tokyo (JP); RIKEN, Saitama (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 415 days.

(21) Appl. No.: 18/258,727

(22) PCT Filed: Oct. 11, 2021

(86) PCT No.: PCT/JP2021/037604
§ 371 (c)(1),
(2) Date: Jun. 21, 2023

(87) PCT Pub. No.: WO2022/137738
PCT Pub. Date: Jun. 30, 2022

(65) Prior Publication Data
US 2024/0038427 A1    Feb. 1, 2024

(30) Foreign Application Priority Data
Dec. 22, 2020 (JP) ................................ 2020-212905

(51) Int. Cl.
*H01F 6/06* (2006.01)

(52) U.S. Cl.
CPC ..................................... *H01F 6/06* (2013.01)

(58) Field of Classification Search
CPC ......................................................... H01F 6/06
(Continued)

(56) References Cited

U.S. PATENT DOCUMENTS

| 4,369,636 A | * | 1/1983 | Purcell | H02G 15/34 62/51.1 |
| 4,509,030 A | * | 4/1985 | Vermilyea | H01F 6/06 505/879 |

(Continued)

FOREIGN PATENT DOCUMENTS

| JP | 2020194882 A | * | 12/2020 |
| JP | 7236076 B2 | * | 3/2023 |

*Primary Examiner* — Alexander Talpalatski
(74) *Attorney, Agent, or Firm* — Studebaker Brackett PLLC

(57) ABSTRACT

A superconducting coil device according to one embodiment of the present invention includes: A superconducting coil device including: a bobbin having a tubular body; superconducting wires, a part of which constitutes a wound portion where the superconducting wires are wound on the bobbin; a bobbin-side guide portion holding the superconducting wires extending from the bobbin, the bobbin-side guide portion being provided to extend in a bobbin axial direction, which is an axial direction of the body of the bobbin; a first guide portion holding the superconducting wires extending from the bobbin-side guide portion, the first guide portion being arranged on an outer side of the bobbin-side guide portion in a direction intersecting the bobbin axial direction and provided to extend in the direction intersecting the bobbin axial direction; and a second guide portion capable of holding the superconducting wires extending from the first guide portion, the second guide portion being provided to extend in a direction intersecting the direction of extension of the first guide portion, in which the supercon- (Continued)

ducting wires are constituted of a plurality of wires connected in series, and a connection portion between the wires is fixed to at least either one of the first guide portion and the second guide portion.

8 Claims, 10 Drawing Sheets

(58) Field of Classification Search
USPC .......................................................... 335/216
See application file for complete search history.

(56) References Cited

U.S. PATENT DOCUMENTS

| | | | | |
|---|---|---|---|---|
| 5,298,679 | A * | 3/1994 | Wu ........................... | H01F 6/04 |
| | | | | 505/887 |
| 6,921,042 | B1 * | 7/2005 | Goodzeit ............... | H02K 55/00 |
| | | | | 335/214 |
| 7,924,126 | B2 * | 4/2011 | Hait ......................... | H01F 6/02 |
| | | | | 505/879 |
| 11,508,505 | B2 * | 11/2022 | Li ............................. | H01F 6/06 |
| 11,551,842 | B2 * | 1/2023 | Hamada .............. | H01F 27/2823 |
| 2013/0029849 | A1 * | 1/2013 | Wu ........................... | H01F 6/06 |
| | | | | 505/211 |
| 2016/0064128 | A1 * | 3/2016 | Kummeth ............ | H10N 60/355 |
| | | | | 505/211 |
| 2020/0075207 | A1 | 3/2020 | Maeda et al. | |
| 2020/0365303 | A1 * | 11/2020 | Hamada .............. | H01F 27/2823 |

\* cited by examiner

SUPERCONDUCTING COIL DEVICE

TECHNICAL FIELD

The present invention relates to a superconducting coil device including superconducting wires.

BACKGROUND ART

For example, Patent Document 1 and the like disclose a conventional superconducting coil device. In the technique disclosed in the document, a connection portion (in the document, joint portion) between wires (in the document, first portion and second portion) constituting superconducting wire is arranged away from a wound portion (coil) of the superconducting wire.

PRIOR ART DOCUMENTS

Patent Documents

Patent Document 1: PCT International Publication No. 2018-211797

SUMMARY OF THE INVENTION

Problems to be Solved by the Invention

There is a desire for the superconducting wires including such a connection portion to be efficiently arranged in a limited space.

An objective of the present invention is to provide a superconducting coil device enabling efficient arrangement of superconducting wires including a connection portion in a limited space.

Means for Solving the Problems

A superconducting coil device includes a bobbin, superconducting wires, a bobbin-side guide portion, a first guide portion, and a second guide portion. The bobbin has a tubular body. A part of the superconducting wires constitutes a wound portion where the superconducting wires are wound on the bobbin. The bobbin-side guide portion holds the superconducting wires extending from the bobbin, and is provided to extend in a bobbin axial direction, which is an axial direction of the body of the bobbin. The first guide portion holds the superconducting wires extending from the bobbin-side guide portion, and is arranged on an outer side of the bobbin-side guide portion in a direction intersecting the bobbin axial direction and provided to extend in the direction intersecting the bobbin axial direction. The second guide portion is capable of holding the superconducting wires extending from the first guide portion, and is provided to extend in a direction intersecting the direction of extension of the first guide portion. The superconducting wires are constituted of a plurality of wires connected in series, and a connection portion between the wires is fixed to at least either one of the first guide portion and the second guide portion.

Effects of the Invention

Due to the above-described configuration, the superconducting wires including the connection portion can be efficiently arranged in a limited space.

DESCRIPTION OF EMBODIMENT

Figure 1:
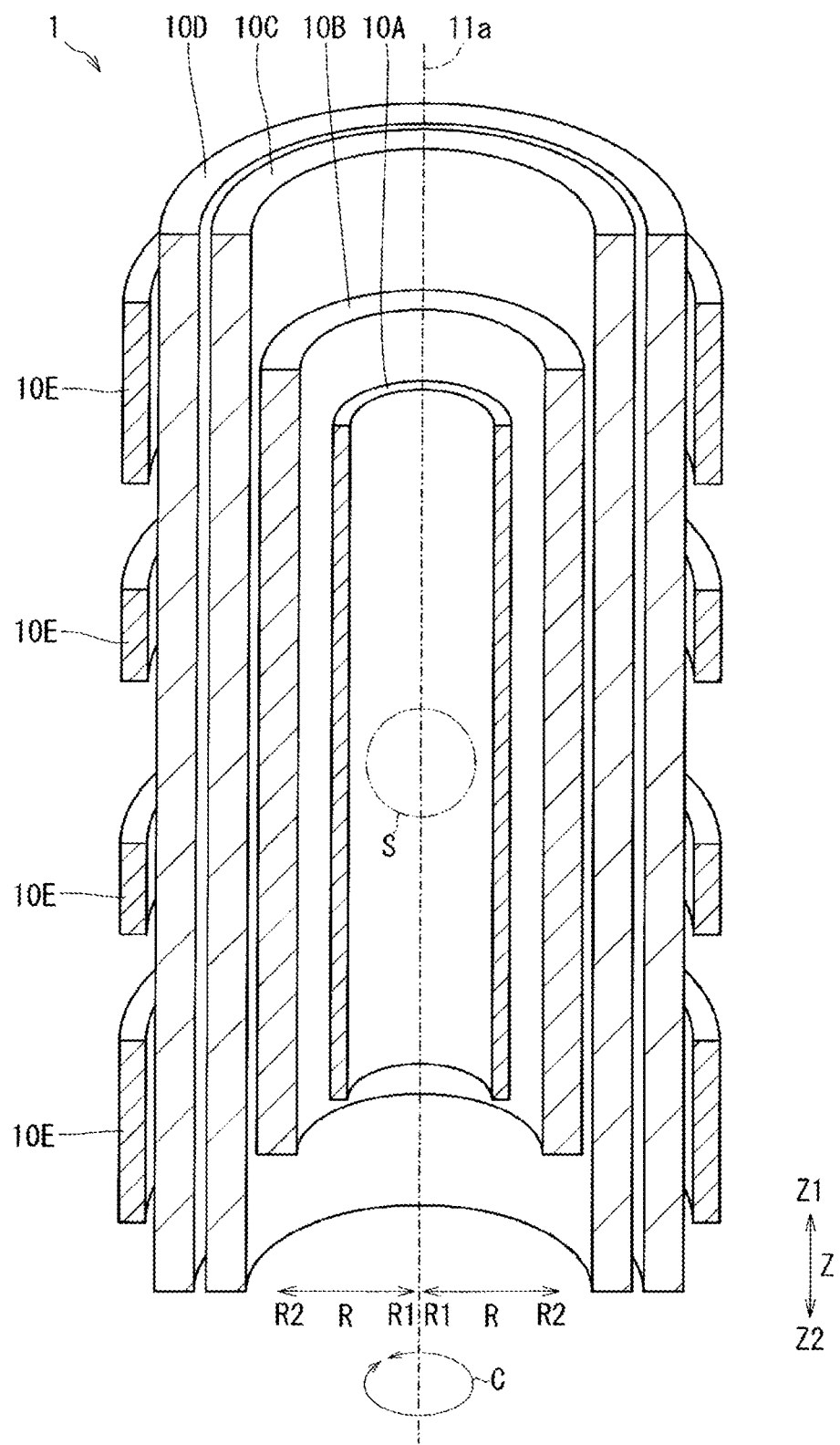
FIG. 1 is a perspective cross-sectional view showing an outline of a superconducting coil device 1.

The superconducting coil device 1 shown in FIG. 1 is described hereinafter with reference to FIGS. 1 to 10. Note that, in order to avoid complexity of illustration in FIG. 1, each superconducting coil is represented only by a wound portion (for example, wound portion 21 in FIG. 2).

The superconducting coil device 1 is used in a superconducting magnet. The superconducting coil device 1 is cooled so that the superconducting wires 20 (see FIG. 2) can maintain a superconducting state. The superconducting coil device 1 may be cooled either by a refrigerator that maintains the temperature of the superconducting wires 20, or by a coolant (for example liquid helium), so that the superconducting wires 20 can maintain a superconducting state. The superconducting coil device 1 is accommodated in a low-temperature container (cryostat) which is not illustrated. The superconducting coil device 1 is in a cylindrical shape. The superconducting coil device 1 is provided with a plurality of layers of superconducting coils. The number of the layers is five in the example shown in FIG. 1, but may be less than or equal to four or greater than or equal to six. The number of superconducting coil(s) may be one or more than one. Specifically, for example, the superconducting coil device 1 includes a first superconducting coil 10A, a second superconducting coil 10B, a third superconducting coil 10C, a fourth superconducting coil 10D, and a fifth superconducting coil 10E in this order from a radially inner side R1 to a radially outer side R2. An inner space S (cavity) may be provided on the radially inner side R1 of the superconducting coil device 1. Directions such as "radially inner side R1" will be described later in detail.

For example, one of each of the first superconducting coil 10A, the second superconducting coil 10B, the third superconducting coil 10C, and the fourth superconducting coil 10D is provided. The fifth superconducting coil 10E is a correction coil for correcting magnetic fields generated by the superconducting coil device 1. For example, the fifth superconducting coil 10E is provided in a plurality. The number of the fifth superconducting coils 10E is four in the example shown in FIG. 1, but may be less than or equal to three or greater than or equal to five. The correction coils may be provided in a plurality of layers.

Figure 2:
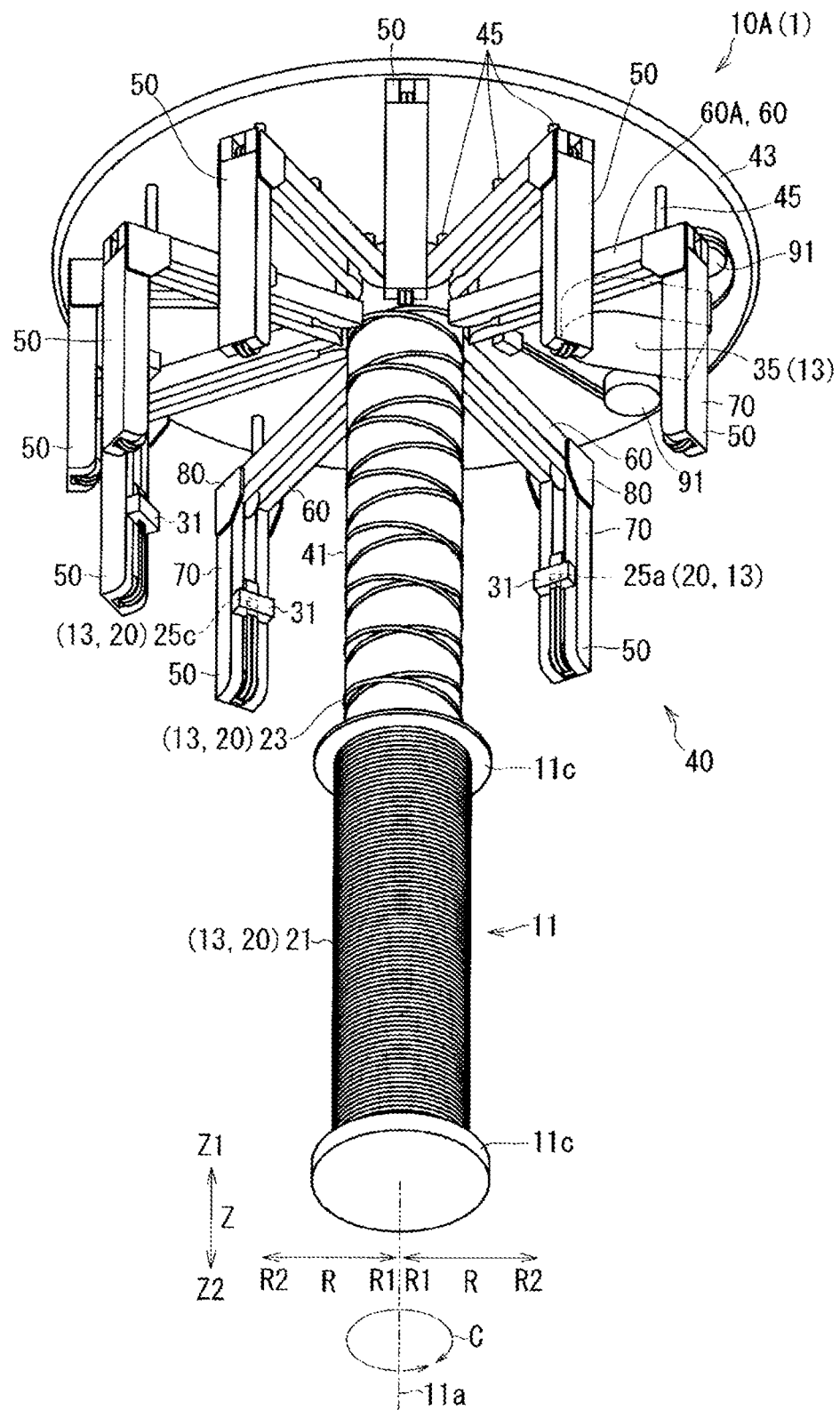
FIG. 2 is a perspective view illustrating a first superconducting coil 10A shown in FIG. 1.

The first superconducting coil 10A is arranged most on the radially inner side R1 among the superconducting coils constituting the superconducting coil device 1. As shown in FIG. 2, the first superconducting coil 10A is provided with a bobbin 11, the circuit portion 13 (see FIG. 4), and the guide device 40.

Figure 3:
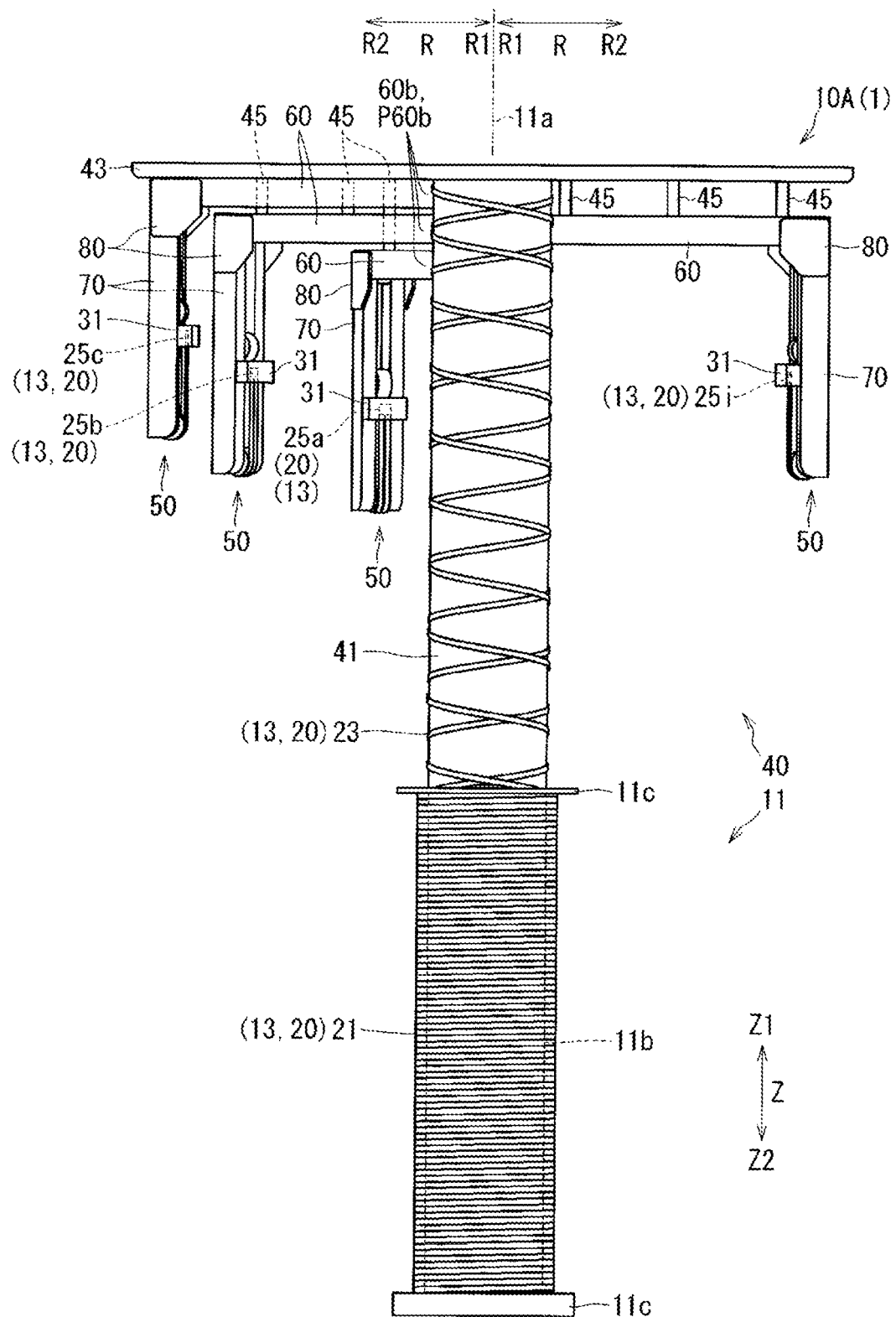
FIG. 3 is a diagram illustrating the first superconducting coil 10A shown in FIG. 2 seen in a direction orthogonal to an axial direction Z.

The bobbin 11 is a member around which the superconducting wires 20 are wound. As shown in FIG. 3, the bobbin 11 is provided with a body 11b and a flange portion 11c. The body 11b has a tubular shape (for example, a cylindrical shape), and is a portion around which the superconducting wires 20 are wound. The flange portion 11c is provided in each of portions on an axially upper side Z1 and an axially lower side Z2 of the body 11b. The flange portion 11c protrudes to the radially outer side R2 from the body bib.

Definition of Directions

A center axis of the bobbin 11 is defined as the bobbin center axis 11a. The bobbin center axis 11a is a center axis of the body 11b, which is a center axis of the body 11b extending in the longitudinal direction of the body 11b. The bobbin center axis 11a is a center axis of the bobbin 21 (described later). As shown in FIG. 2, a direction in which the bobbin center axis 11a extends is defined as an axial direction Z (bobbin axial direction). The axial direction Z may be either the vertical direction, the horizontal direction, or a direction inclined with respect to the horizontal direction. Regarding the axial direction Z, the side (or orientation (the same applies hereinafter)) from the bobbin 11 toward a bobbin-side guide portion 41 (described later) is defined as the axially upper side Z1, and the opposite side thereof is defined as the axially lower side Z2. Note that the axially upper side Z1 may or may not be an upper side in the vertical direction. A radial direction of a virtual circle (not illustrated) which is orthogonal to the bobbin center axis 11a and around the bobbin center axis 11a is defined as a radial direction R. When the axial direction Z is the vertical direction, the radial direction R is the horizontal direction. Regarding the radial direction R, the side toward the bobbin center axis 11a is defined as the radially inner side R1, and the side away from the bobbin center axis 11a is defined as the radially outer side R2. The circumferential direction of the virtual circle is defined as the circumferential direction C.

Figure 4:
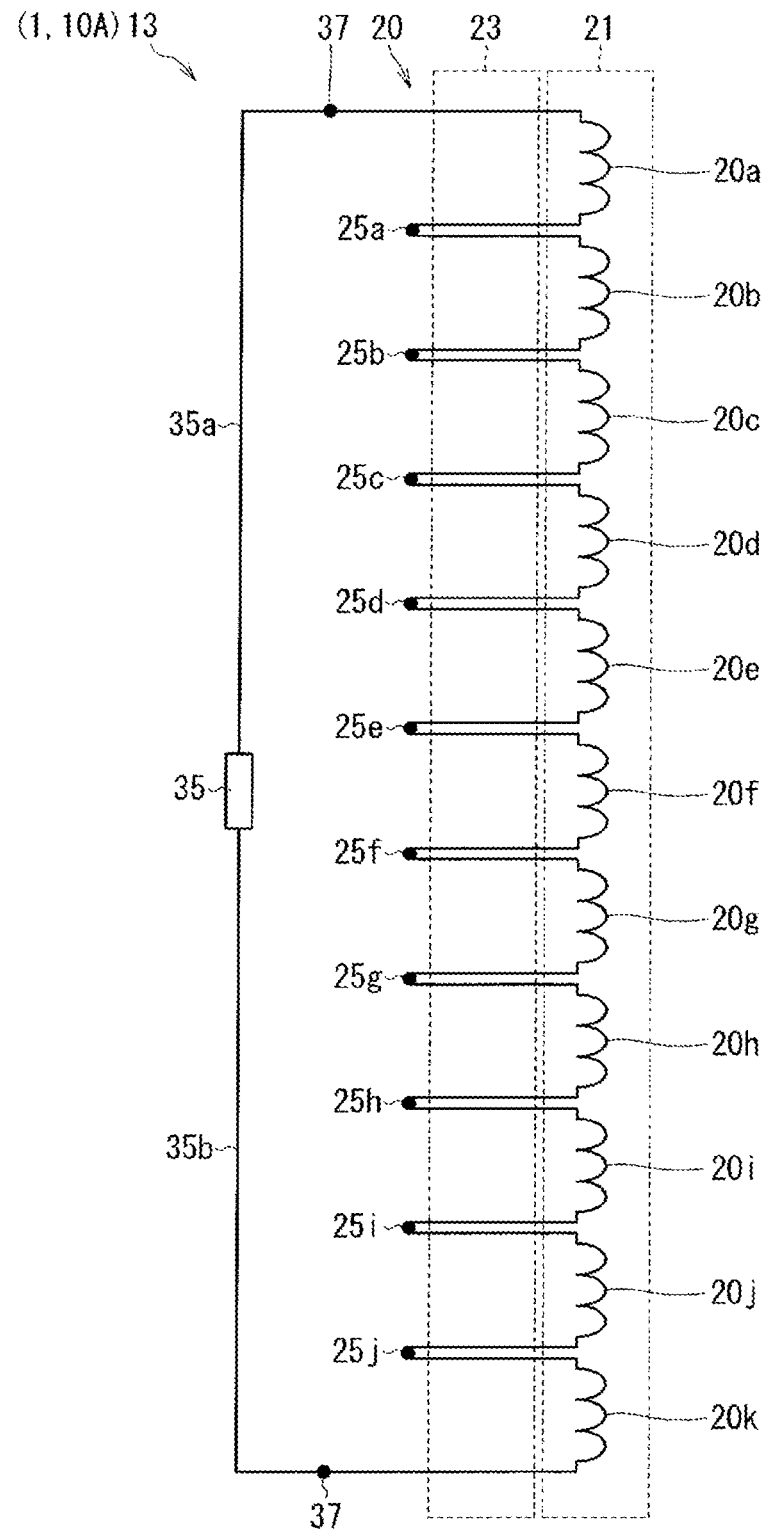
FIG. 4 is a diagram illustrating a circuit portion 13 of the first superconducting coil 10A shown in FIG. 2.

The circuit portion 13 is an electric circuit and the like for generating a magnetic field in the wound portion 21 (described later). As shown in FIG. 4, the circuit portion 13 is provided with the superconducting wires 20, a connection portion storage portion 31 (see FIG. 3), a persistent-current switch 35, a switch connection portion 37 (see FIG. 4), and a switch connection portion housing portion 39 (see FIG. 5).

Figure 9:
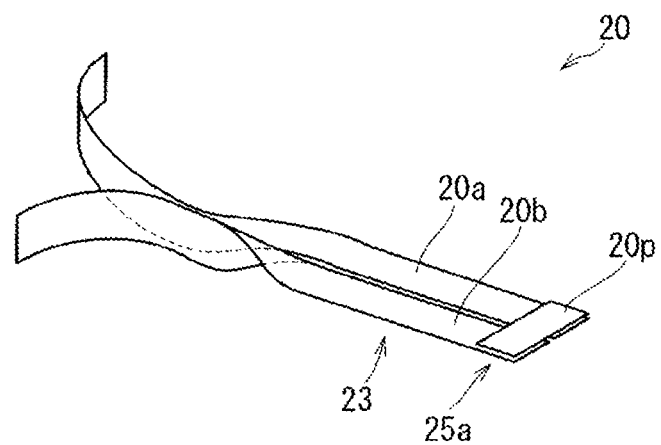
FIG. 9 is a perspective view illustrating a connection portion 25a and the like in a case in which two wires of the superconducting wires 20 shown in FIG. 6 are in a lateral arrangement.

The superconducting wires 20 are wires which can be in a superconducting state when cooled. The superconducting wires 20 are, for example, high-temperature superconducting wires such as yttrium-based superconducting wires. The superconducting wires 20 may also be low-temperature superconducting wires. As shown in FIG. 9, the superconducting wires 20 may or may not be in a tape shape (belt shape or thin film shape). When seen in the longitudinal direction of the superconducting wires 20, the cross section of the superconducting wires 20 may be either polygonal (for example, rectangular or hexagonal) or circular. As shown in FIG. 4, the superconducting wires 20 include a plurality of wires 20a to 20k. As shown in FIG. 2, the superconducting wires 20 include the wound portion 21, a lead wire portion 23, and the connection portions 25a to 25j shown in FIG. 4.

The plurality of wires 20a to 20k are connected to each other in series. A part of each of the wires 20a to 20k constitutes the wound portion 21. The plurality of wires 20a to 20k are each formed integrally and continuously. Different wires (for example, the wire 20a and the wire 20b) are connected with each other by the connection portions 25a to 25j, and are not formed integrally and continuously.

The wound portion 21 is a coil wound around the bobbin 11 as shown in FIG. 2.

The lead wire portion 23 is arranged outside the bobbin 11. The lead wire portion 23 is arranged to be drawn from the wound portion 21. The lead wire portion 23 is provided to ensure an insulation property, and is, for example, covered by an insulating member. Specifically, for example when the lead wire portion 23 is in a tape shape, the lead wire portion 23 may be interposed between tape-shaped insulating members. The tape-shaped insulating member may be either a glass tape or a tape of an organic material.

The connection portions 25a to 25j are portions (joints) where the wires 20a to 20k are connected (joined) with each other, as shown in FIG. 4. The connection portions 25a to 25j are portions (superconducting coil connection portions) where the wires 20a to 20k constituting the wound portion 21 are connected with each other. The number of the connection portions 25a to 25j provided may be one or greater than one. In the example shown in FIG. 4, the number of the connection portions 25a to 25j is ten. For example, the connection portion 25a is a portion where the wire 20a and the wire 20b are connected, the connection portion 25b is a portion where the wire 20b and the wire 20c are connected, and the connection portion 25c is a portion where the wire 20c and the wire 20d are connected (the same applies to the connection portions 25d to 25j). Since it is difficult to constitute the entire wound portion 21 with a single wire (for example, the wire 20a or the like) which is integrally and continuously formed, the plurality of wires 20a to 20k are connected with each other by the connection portions 25a to 25j. It is preferred that the wires 20a to 20k are treated to be connected with each other such that the electric resistance of the connection portions 25a to 25j is as low as possible. It is to be noted that the number of the connection portions is not limited to ten as shown in FIG. 4, and may be less than or equal to nine, or greater than or equal to 11. Note that in FIG. 2, the plurality of connection portions 25a to 25j are only partially denoted by reference numerals.

Specific examples of the connection portions 25a to 25j are as follows. Hereinafter, the case in which the wires 20a to 20k shown in FIG. 4 are tape-shaped is described. In addition, as an example of two of the wires connected by the connection portions 25a to 25j, the wires 20a, 20b connected by the connection portion 25a are described. As shown in FIG. 9, the wires 20a and 20b are arranged such that faces thereof orthogonal to the thickness direction (faces extending in the width direction and the longitudinal direction) are flush (or substantially flush). This arrangement is referred to as "lateral arrangement". The two wires 20a, 20b are arranged such that ends thereof in the longitudinal direction match, and the wires 20a, 20b overlap the connecting material 20p at the ends of the two wires 20a, 20b. The connecting material 20p can be in a superconducting state when cooled, and is sheet-shaped, for example. Heat-treating the wires 20a, 20b and the connecting material 20p in this state connects the wires 20a, 20b via the connecting material 20p. This heat treatment is sintering, for example, and is carried out at about 800° C., for example. After connecting the wires 20a, 20b by the heat treatment, the required performance may not be obtained in the connection portion 25a. In this case, for example, the connection portion 25a may be disconnected and the wires 20a, 20b may be treated again to be connected. Alternatively, when the required performance is not obtained in the connection portion 25a, the heat treatment may be carried out again without disconnecting the connection portion 25a. As described above, the connection treatment of the wires 20a, 20b may be redone. Each of the wires 20a, 20b thus needs to have extra length for enabling the connection treatment to be redone.

Figure 10:
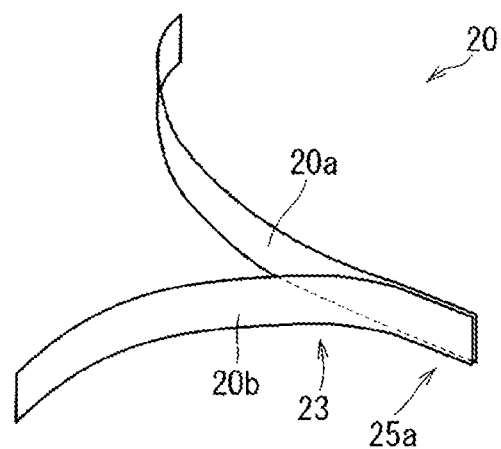
FIG. 10 is a perspective view illustrating a connection portion 25a and the like in a case in which two wires of the superconducting wires 20 shown in FIG. 6 are arranged to overlap each other.

Note that, in the connection portion 25a, the two wires 20a, 20b do not need to be connected in the state of the lateral arrangement. For example, the two wires 20a, 20b may be connected in a state of overlapping each other in the connection portion 25a, as shown in FIG. 10. In addition, although these examples are specific examples of the connection portions 25a to 25j in a case in which the wires 20a to 20k shown in FIG. 4 are tape-shaped, the wires 20a to 20k are not required to be tape-shaped. Hereinafter, as an example of the connection portions 25a to 25j, the connection portion 25a is principally described. The matters related to the connection portion 25a described below may be applied to at least a part (for example, all) of the connection portions 25b to 25j.

Figure 6:
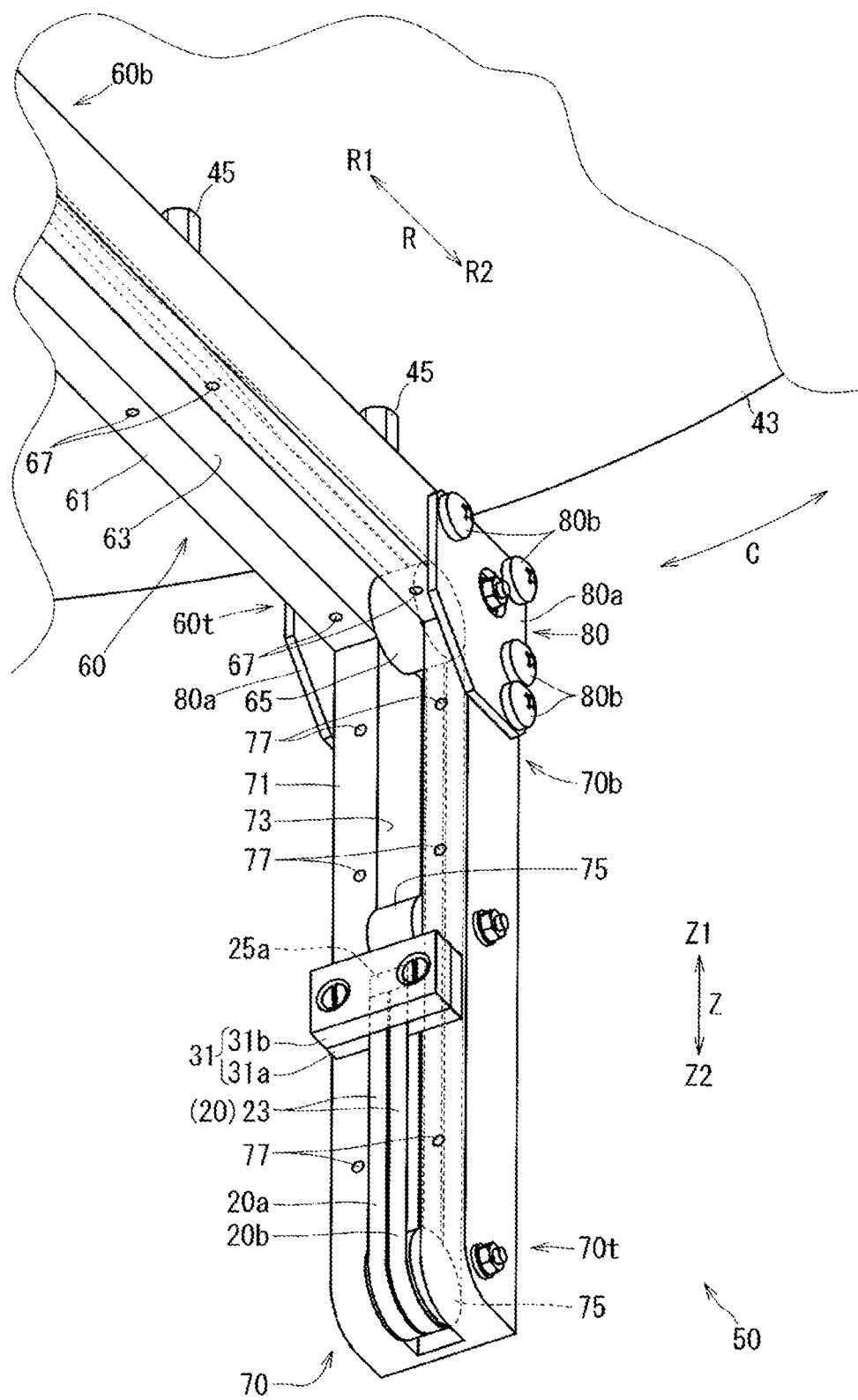
FIG. 6 is a perspective view illustrating one of guide portions 50 shown in FIG. 2.

The connection portion housing portion 31 houses the connection portion 25a as shown in FIG. 6. The connection portion housing portion 31 is, for example, box-shaped (joint housing box) or the like. The connection portion housing portion 31 is cuboidal in the example shown in FIG. 6, but is not required to be cuboidal. For example, the connection portion housing portion 31 includes a first housing member 31a and a second housing member 31b. The first housing member 31a and the second housing member 31b are arranged to interpose the connection portion 25a therebetween, to cover the connection portion 25a as a whole. The first housing member 31a and the second housing member 31b are fixed to each other (for example with a screw or the like).

Figure 5:
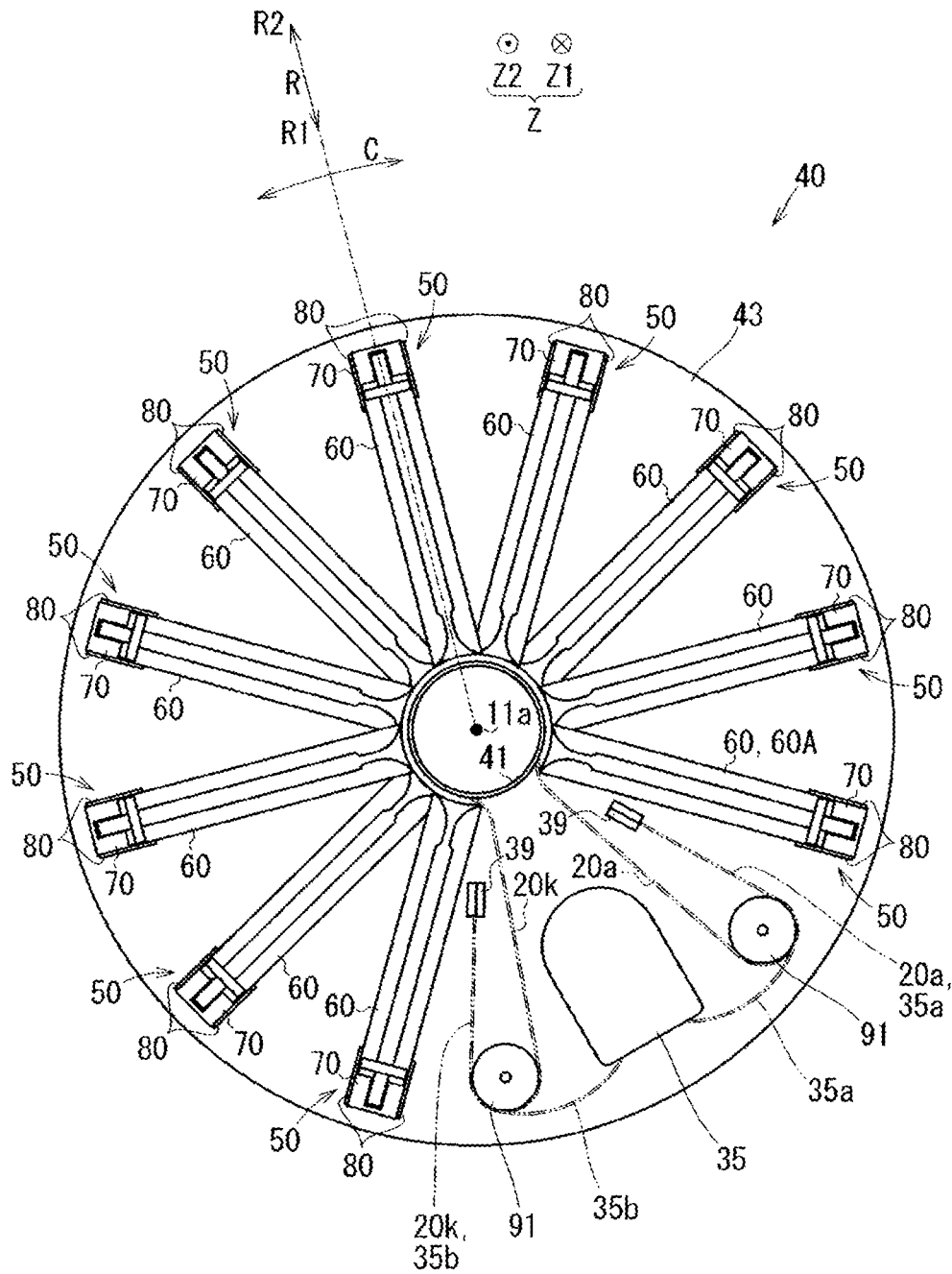
FIG. 5 is a diagram illustrating a guide device 40 and the like shown in FIG. 2 seen from an axially lower side Z2.

The persistent-current switch 35 switches between connection in the superconducting state and connection in the normal conducting state, of both ends of the wires 20a to 20k shown in FIG. 4, in other words both ends of the superconducting wires 20. As shown in FIG. 5, the persistent-current switch 35 is arranged not to interfere with the guide portion 50 (for example, the first guide portion 60) described later. As shown in FIG. 2, the persistent-current switch 35 is attached to, for example, the joint member 43 described later, for example to a face on the axially lower side Z2 of the joint member 43. As shown in FIG. 4, the persistent-current switch 35 includes switch lead wires 35a, 35b. The switch lead wires 35a, 35b are connected to both ends of the wires 20a to 20k. The switch lead wires 35a, 35b are wires which can be in a superconducting state when cooled, as with the superconducting wires 20. The switch lead wires 35a, 35b may or may not be tape-shaped.

The switch connection portion 37 is where the wires 20a and 20k on both outermost ends among the wires 20a to 20k including the wound portion 21 are connected to the switch lead wires 35a, 35b. Two switch connection portions 37 are provided. A specific example of connection in the switch connection portion 37 is similar to the specific example of connection of the wires 20a, 20b in the connection portion 25a.

A switch connection portion housing portion 39 (see FIG. 5) houses the switch connection portion 37. A specific example of the configuration (shape, connection mode, etc.) of the switch connection portion housing portion 39 is similar to that of the connection portion housing portion 31 (see FIG. 6). As shown in FIG. 5, the switch connection portion housing portion 39 is fixed to, for example, the joint member 43 described later.

The guide device 40 is for arranging and holding the connection portions 25a to 25j with high space efficiency as shown in FIG. 2 (see FIG. 4 for the connection portions 25b and 25d to 25j other than the connection portions 25a, 25c shown in FIG. 2 (the same applies hereinafter)). In addition, the guide device 40 shown in FIG. 2 guides the lead wire portion 23 such that the connection portions 25a to 25j can be arranged with high space efficiency. The guide device 40 is preferably configured to be able to arrange and hold the connection portions 25a to 25j appropriately even when reworking the connection of the connection portions 25a to 25j. The guide device 40 includes the bobbin-side guide portion 41, the joint member 43, a guide portion-fixing portion 45, the guide portion 50, and a switch connection curving portion 91.

The bobbin-side guide portion 41 is a portion (lead guide portion) that holds the lead wire portion 23 so as to guide the lead wire portion 23 to a position away from the bobbin 11 in the axially upper side Z1. The bobbin-side guide portion 41 is provided to extend in the axially upper side Z1. For example, the bobbin-side guide portion 41 is provided to extend to the axially upper side Z1 from the bobbin 11. The bobbin-side guide portion 41 is fixed to the bobbin 11. The bobbin-side guide portion 41 may be integral with or separated from the bobbin 11. As shown in FIG. 5, the bobbin-side guide portion 41 is tubular, for example. The bobbin-side guide portion 41 may be in the shape of either a circular tube or a polygonal tube. Note that the bobbin-side guide portion 41 is not required to be tubular. The number of the bobbin-side guide portion 41 may be greater than or equal to one. In the case in which a plurality of bobbin-side guide portions 41 are provided, for example, the plurality of bobbin-side guide portions 41 may be arranged at intervals in the radial direction R.

The bobbin-side guide portion 41 holds the lead wire portion 23 extending (arranged to extend) from the bobbin 11 as shown in FIG. 2. For example, the lead wire portion 23 held by the bobbin-side guide portion 41 is wound around the bobbin-side guide portion 41, for example more sparsely than the wound portion 21 wound around the bobbin 11. The lead wire portion 23 held by the bobbin-side guide portion 41 is fixed to the bobbin-side guide portion 41 by a resin (for example, an epoxy resin). Note that the lead wire portion 23 held by the bobbin-side guide portion 41 is not required to be wound around the bobbin-side guide portion 41, and may be, for example, arranged to extend in the axial direction Z.

The joint member 43 supports the plurality of guide portions 50 integrally. The joint member 43 is supported by (fixed to) the bobbin-side guide portion 41. For example, the joint member 43 is fixed to an end on the axially upper side Z1 of the bobbin-side guide portion 41. The term "end" encompasses an end and the vicinity thereof (the same applies hereinafter). The joint member 43 is provided to extend outward in a direction intersecting the axial direction Z from the bobbin-side guide portion 41. The "direction intersecting the axial direction Z" may be a direction orthogonal to the axial direction Z, or a direction inclined with respect to the axial direction Z. For example, the joint member 43 is provided to extend from the bobbin-side guide portion 41 toward the radially outer side R2. Hereinafter, a case in which the direction intersecting the axial direction Z is the radial direction R is described. The description below regarding the radial direction R may be considered as the description regarding the direction intersecting the axial direction Z. For example, the joint member 43 may be circular or substantially circular, or polygonal or substantially polygonal when seen in the axial direction Z. The joint member 43 is, for example, plate-like (joint plate). The number of the joint member 43 may be greater than or equal to one. In the case in which a plurality of joint members 43 are provided, the plurality of joint members 43 may be arranged to be aligned in the axial direction Z, at intervals in the axial direction Z.

The guide portion-fixing portion 45 fixes (supports) the guide portion 50 to the joint member 43. The guide portion-fixing portion 45 is arranged between the joint member 43 and the guide portion 50 (more specifically the first guide portion 60 described later). For example, the guide portion-fixing portion 45 may be in a rod shape, a block shape, or the like. The guide portion-fixing portion 45 may or may not be arranged to extend in the axial direction Z. Note that in FIG. 2, the plurality of guide portion-fixing portions 45 are only partially denoted by reference numerals.

The guide portion 50 holds the lead wire portion 23 so as to guide the lead wire portion 23 to a position away from the bobbin-side guide portion 41. The guide portion 50 may be arranged on the axially lower side Z2 of the joint member 43, or on the axially upper side Z1 of the joint member 43. Hereinafter, a case in which the guide portion 50 is arranged on the axially lower side Z2 of the joint member 43 is described. A plurality of guide portions 50 are provided. The number of the guide portions 50 is 10 in the example shown in FIG. 5, but may be less than or equal to nine or greater than or equal to 11. Note that it is preferred that the number of the guide portions 50 is the same as the number of the connection portions 25a to 25j. Hereinafter, one guide portion 50 is principally described. As shown in FIG. 6, the guide portion 50 (more specifically, each of the plurality of guide portions 50) includes the first guide portion 60, the second guide portion 70, and the coupling portion 80.

Figure 8:
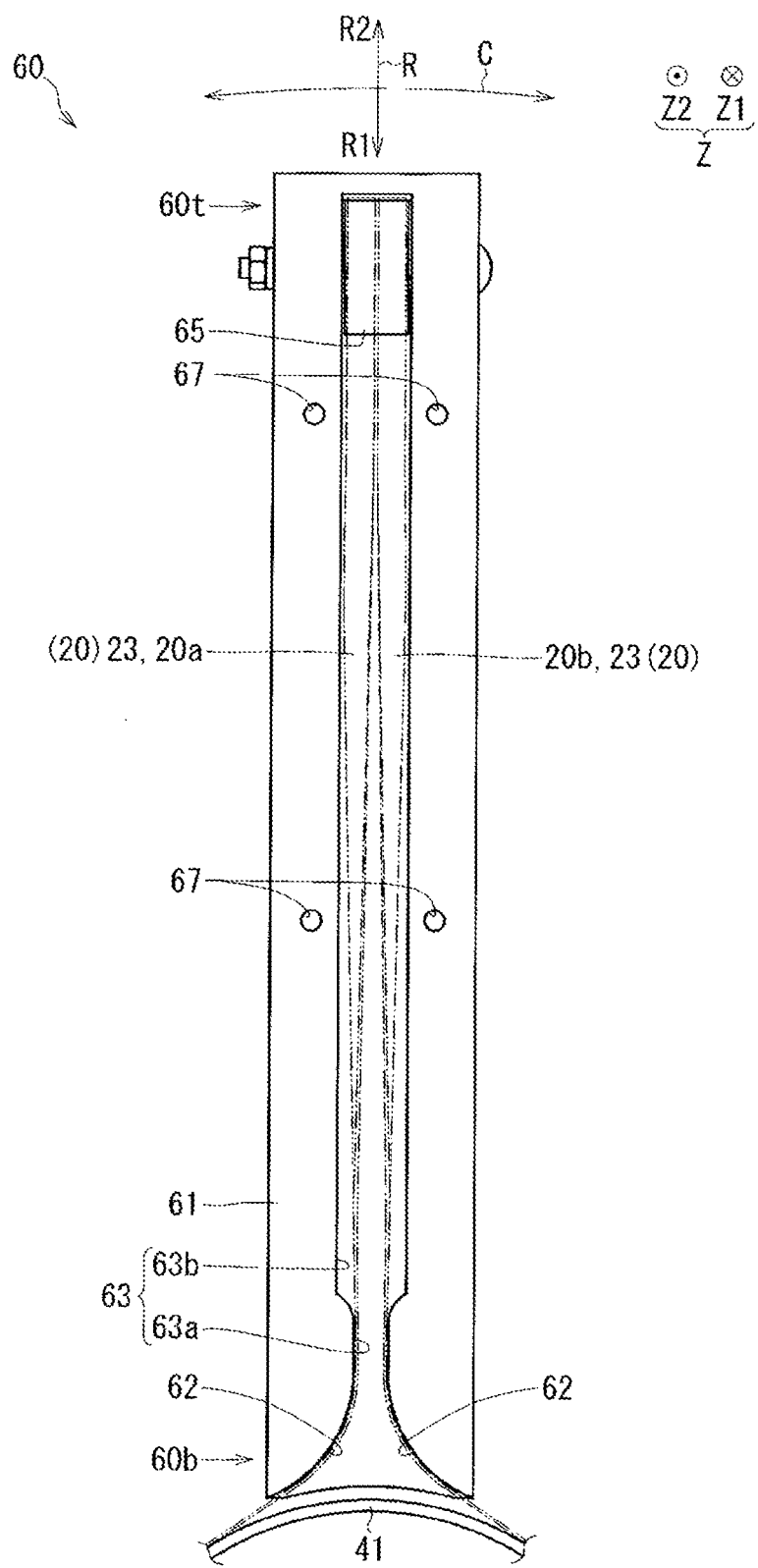
FIG. 8 is a diagram illustrating a first guide portion 60 and the like shown in FIG. 6 seen in the axial direction Z.

The first guide portion 60 holds the lead wire portion 23 so as to guide the lead wire portion 23 from the bobbin-side guide portion 41 (see FIG. 2) to an outer side in a direction intersecting the axial direction Z (for example, the radially outer side R2). As shown in FIG. 8, the first guide portion 60 is arranged on the radially outer side R2 of the bobbin-side guide portion 41. The first guide portion 60 is arranged with an interval in the radial direction R from the bobbin-side guide portion 41. A size of the interval between the first guide portion 60 and the bobbin-side guide portion 41 is set such that the lead wire portion 23 can be arranged therein. Note that when the lead wire portion 23 can be arranged to span from the bobbin-side guide portion 41 to the first guide portion 60, the first guide portion 60 may be in contact with the bobbin-side guide portion 41. As shown in FIG. 2, the first guide portion 60 is fixed to the joint member 43. The first guide portion 60 may be arranged at an interval in the axial direction Z from the joint member 43, and specifically may be fixed to the joint member 43 via the guide portion-fixing portion 45. The first guide portion 60 may be in contact with the joint member 43, or directly fixed to the joint member 43 (without intervention of the guide portion-fixing portion 45) (see FIG. 3). The first guide portion 60 is, for example, substantially cuboidal.

The first guide portion 60 is provided to extend in the radial direction R as shown in FIG. 5. The longitudinal direction of the first guide portion 60 is the radial direction R. As shown in FIG. 8, the first guide portion 60 holds the lead wire portion 23 extending from the bobbin-side guide portion 41. In FIG. 8, the lead wire portion 23 is shown by a chain double-dashed line. The first guide portion 60 holds the lead wire portion 23 along the first guide portion 60. The first guide portion 60 holds the lead wire portion 23 such that the lead wire portion 23 extends in the direction of extension of the first guide portion 60. An end of the first guide portion 60 on the bobbin-side guide portion 41 side (for example the radially inner side R1) is defined as a first guide portion base end 60b. An end of the first guide portion 60 on an opposite side of the bobbin-side guide portion 41 (for example the radially outer side R2) is defined as a first guide portion tip end 60t. The position (for example the height level) of the first guide portion base end 60b in the axial direction Z is defined as a base end axial position P60b (see FIG. 3). The first guide portion 60 includes a first main body portion 61, an inclined portion 62, a first guide portion-curving portion 65, and a first connection portion-attaching portion 67 (connection portion-attaching portion).

The plurality of first guide portions 60 are arranged radially or substantially radially around the bobbin center axis 11a as shown in FIG. 5. Consequently, the plurality of first guide portion base ends 60b (see FIG. 8) are arranged in proximity to each other. The number of the first guide portions 60 attachable to the joint member 43 is thus limited. In turn, the number of the connection portions 25a to 25j (the number of the connection portions 25a to 25j per guide device 40) is limited. In addition, as a result of the plurality of first guide portion base ends 60b being arranged in proximity to each other, the lead wire portions 23 (see FIG. 8) in the vicinity of the first guide portion base ends 60b are arranged in proximity to each other and may interfere (come into contact, for example get caught) with each other. Consequently, the base end axial positions P60b shown in FIG. 3 are set such that the greatest possible number of guide portions 50 can be attached to the joint member 43, and interference between the lead wire portions 23 (see FIG. 3) can be inhibited. Specifically, the base end axial positions P60b of the plurality of first guide portions 60 are different from each other. In other words, the plurality of first guide portion base ends 60b are arranged to be out of alignment in the axial direction Z. More specifically, the base end axial positions P60b (see FIG. 3) of the first guide portions 60 adjacent in the circumferential direction C seen in the axial direction Z as shown in FIG. 2 are different from each other. Note that the base end axial positions P60b (see FIG. 3) of the first guide portions 60 not being adjacent in the circumferential direction C seen in the axial direction Z are not required to be different. Specifically, there are a plurality of types (three types or three levels in the example shown in FIG. 3) of the base end axial positions P60b. There may be a plurality (three or four in the example shown in FIG. 2) of first guide portions 60 having each type (each level) of the base end axial position P60b.

The first main body portion 61 is provided to extend in the radial direction R as shown in FIG. 8. The first main body portion 61 is a member that is, for example, substantially cuboidal (see FIG. 6).

The inclined portion 62 guides and holds the lead wire portion 23 such that the lead wire portion 23 is not bent between the bobbin-side guide portion 41 and a first groove portion 63. The inclined portion 62 inhibits deterioration of the lead wire portion 23 due to bend. The inclined portion 62 is provided in the first guide portion base end 60b, for example on both sides of the first guide portion base end 60b in the circumferential direction C. The inclined portion 62 has such a shape that the lead wire portion 23 can be arranged to extend smoothly from an outer face (for example, outer peripheral face) of the bobbin-side guide portion 41 to the first groove portion 63. The inclined portion 62 is inclined with respect to the direction of extension of the first groove portion 63 (for example, the radial direction R). The inclined portion 62 is inclined with respect to an outer face of the bobbin-side guide portion 41 in the vicinity of the first guide portion base end 60*b*. The inclined portion 62 has a curved shape, for example an arc-like shape, when seen in the axial direction Z. The lead wire portion 23 guided by the inclined portion 62 is arranged along the inclined portion 62.

The first groove portion 63 accommodates the lead wire portion 23 to guide and hold the lead wire portion 23. The first groove portion 63 is provided in the first main body portion 61. As shown in FIG. 6, the first groove portion 63 is recessed in the axial direction Z for example, more specifically recessed from a face of the first main body portion 61 on the axially lower side Z2 toward the axially upper side Z1. As shown in FIG. 8, the first groove portion 63 is provided to extend in the direction of extension of the first guide portion 60 (for example the radial direction R). The lead wire portion 23 accommodated in the first groove portion 63 is arranged to extend in the direction of extension of the first groove portion 63 (for example, the radial direction R). The first groove portion 63 includes a first groove portion base end side portion 63*a* and a first groove portion main body portion 63*b*.

The first groove portion base end side portion 63*a* is a part of the first groove portion 63 on the first guide portion base end 60*b* side (for example, a part on the radially inner side R1). In the first groove portion base end side portion 63*a*, two wires (for example the wires 20*a*, 20*b*) are arranged to face each other in the circumferential direction C. The width direction of each of the two wires 20*a*, 20*b* accommodated in the first groove portion base end side portion 63*a* is the axial direction Z or the substantially axial direction Z (see the lead wire portion 23 in FIG. 7).

The first groove portion main body portion 63*b* is provided on the first guide portion tip end 60*t* side (for example, the radially outer side R2) of the first groove portion base end side portion 63*a*. The width of the first groove portion main body portion 63*b* in the circumferential direction C is greater than the width of the first groove portion base end side portion 63*a* in the circumferential direction C. In the first groove portion main body portion 63*b*, each of the two wires 20*a*, 20*b* is arranged from the first groove portion base end side portion 63*a* side to the first guide portion tip end 60*t* side (for example, from the radially inner side R1 to the radially outer side R2) in a twisted manner by 90°. As a result, the width direction of each of the two wires 20*a*, 20*b* accommodated in a portion of the first groove portion main body portion 63*b* on the radially outer side R2 is the circumferential direction C or the substantially circumferential direction C. In addition, the two wires 20*a*, 20*b* accommodated in the portion of the first groove portion main body portion 63*b* on the radially outer side R2 are in the lateral arrangement, aligned in the circumferential direction or the substantially circumferential direction.

Figure 7:
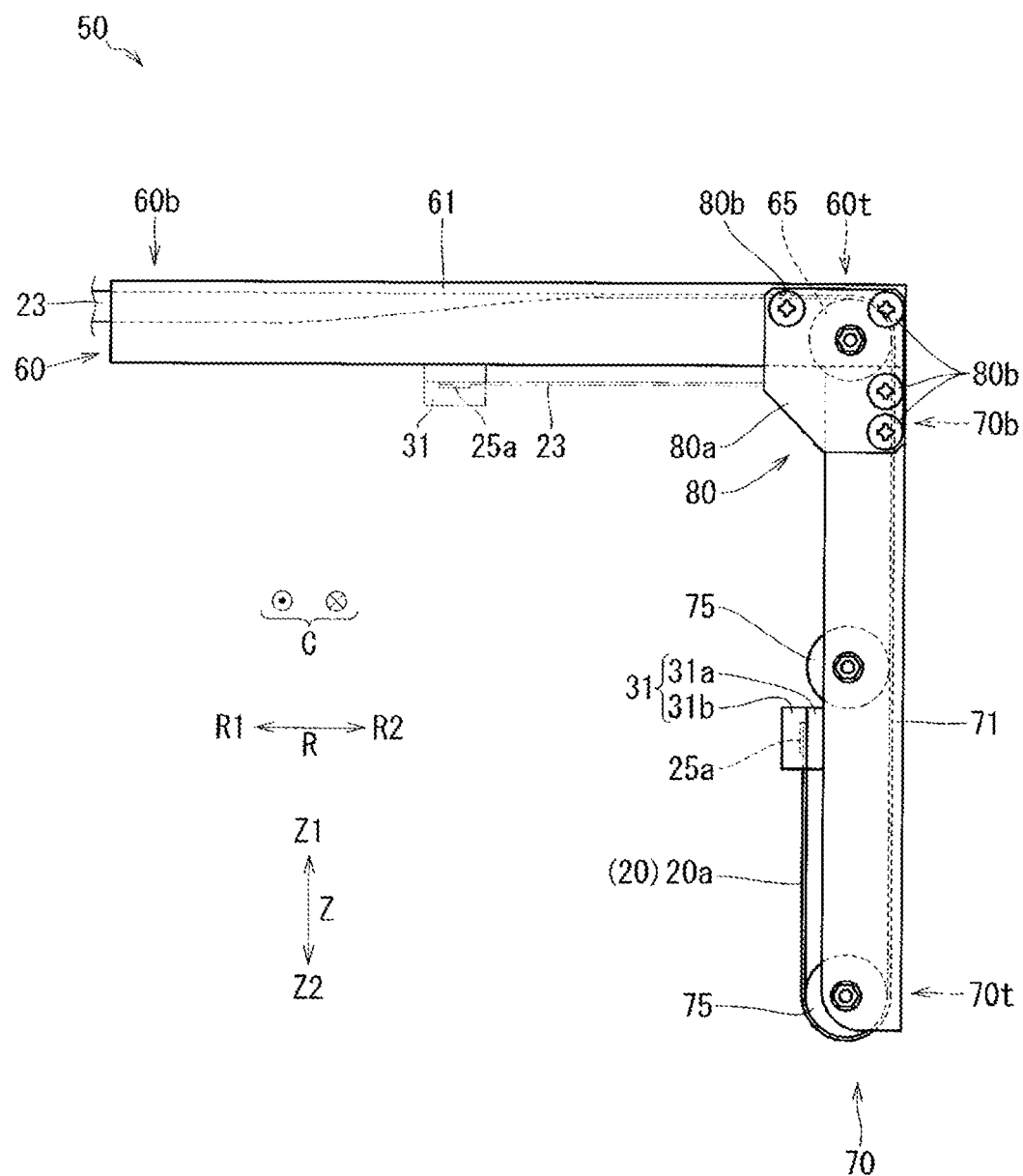
FIG. 7 is a diagram illustrating the guide device 50 and the like shown in FIG. 6 seen in a circumferential direction C.

The first guide portion-curving portion 65 guides the lead wire portion 23 such that the lead wire portion 23 is curved from the direction of extension of the first guide portion 60 (for example, the radial direction R) toward the direction of extension of the second guide portion 70 (for example, the axial direction Z) as shown in FIG. 7. The first guide portion-curving portion 65 is provided in the first main body portion 61. The first guide portion-curving portion 65 is provided in, for example, the first guide portion tip end 60*t*. The first guide portion-curving portion 65 has such a shape that the lead wire portion 23 can be guided without being bent. Specifically, the first guide portion-curving portion 65 has an arc-shaped part seen in the circumferential direction C, and, for example, is in a circular shape or the like seen in the circumferential direction C. The first guide portion-curving portion 65 is, for example, columnar (see FIG. 6). The first guide portion-curving portion 65 may be either rotatable with respect to the first main body portion 61 (for example a roller), or fixed to the first main body portion 61. As shown in FIG. 8, in the first guide portion-curving portion 65, the two wires 20*a*, 20*b* are in the lateral arrangement, and arranged along the first guide portion-curving portion 65 (for example, along the outer peripheral face of the first guide portion-curving portion 65) as shown in FIG. 7. Note that, instead of providing the first guide portion-curving portion 65 in the first main body portion 61, a member similar to the first guide portion-curving portion 65 may be provided in the second main body portion 71.

The first connection portion-attaching portion 67 (see FIG. 6) is a portion to which the connection portion 25*a* can be attached (see the connection portion 25*a* and the connection portion housing portion 31 shown by chain double-dashed lines in FIG. 7). The first connection portion-attaching portion 67 shown in FIG. 6 is a portion to which the connection portion 25*a* can be attached via the connection portion housing portion 31. The first connection portion-attaching portion 67 is provided in the first main body portion 61. For example, the first connection portion-attaching portion 67 is provided on a face on the axially lower side Z2 of the first main body portion 61. The first connection portion-attaching portion 67 may be provided only in one position in the first main body portion 61. The first connection portion-attaching portion 67 may be provided in a plurality of positions in the first main body portion 61 and is provided in two positions in the example shown in FIG. 6, but may be provided in more than or equal to three positions. In a case of providing the first connection portion-attaching portion 67 in a plurality of positions, the first connection portion-attaching portions 67 in the plurality of positions are arranged at intervals in the direction of extension of the first guide portion 60 (for example, the radial direction R). For example, the first connection portion-attaching portion 67 is provided in both outer side portions in the circumferential direction C of the first groove portion 63 in the first main body portion 61. Specifically, for example, the first connection portion-attaching portion 67 includes a female screw.

The second guide portion 70 holds the lead wire portion 23 so as to guide the lead wire portion 23 from the first guide portion 60 in a direction intersecting the extension direction of the first guide portion 60 (for example, the axial direction Z). The "direction intersecting the extension direction of the first guide portion 60" may be a direction orthogonal to the extension direction of the first guide portion 60, or a direction inclined with respect to the extension direction of the first guide portion 60. Hereinafter, a case in which the direction intersecting the extension direction of the first guide portion 60 is the axial direction Z is described. The description below regarding the axial direction Z of the second guide portion 70 may be considered as the description regarding the direction intersecting the extension direction of the first guide portion 60. The second guide portion 70 is arranged on an opposite side of the joint member 43, with respect to the first guide portion 60 (for example, the axially lower side Z2). The second guide portion 70 is attached to the first guide portion 60. The second guide portion 70 may be attached to the first guide portion tip end 60*t*, or to a position on the radially inner side R1 of the first guide portion tip end 60*t* in the first guide portion 60. As shown in FIG. 3, the second guide portion 70 is attached to each of the plurality of first guide portions 60. Note that there may be the first guide portion 60 to which the second guide portion 70 is not attached. As shown in FIG. 7, the second guide portion 70 is in contact with the first guide portion 60, for example with a face of the first guide portion 60 on the axially lower side Z2.

The second guide portion 70 is provided to extend in the axial direction Z. The longitudinal direction of the second guide portion 70 is the axial direction Z. As shown in FIG. 6, the second guide portion 70 is, for example, substantially cuboidal. The second guide portion 70 can hold the lead wire portion 23 extending from the first guide portion 60. The second guide portion 70 holds the lead wire portion 23 along the second guide portion 70. Specifically, the second guide portion 70 holds the lead wire portion 23 such that the lead wire portion 23 extends in the direction of extension of the second guide portion 70. The second guide portion 70 is detachably attached to the first guide portion 60 (see description of the coupling portion 80). Note that the second guide portion 70 may not be detachable with respect to the first guide portion 60, and may be integrally configured with the first guide portion 60. An end of the second guide portion 70 on the first guide portion 60 side (for example the axially upper side Z1) is defined as a second guide portion base end 70*b*. An end of the second guide portion 70 on an opposite side to the first guide portion 60 side (for example the axially lower side Z2) is defined as a second guide portion tip end 70*t*. The second guide portion 70 includes a second main body portion 71, a second groove portion 73, a second guide portion turn-back portion 75, and a second connection portion-attaching portion 77 (connection portion-attaching portion).

The second main body portion 71 is provided to extend in the axial direction Z. The second main body portion 71 is a member that is, for example, substantially cuboidal.

The second groove portion 73 accommodates the lead wire portion 23 and guides and holds the lead wire portion 23. The second groove portion 73 is provided in the second main body portion 71. The second groove portion 73 is recessed in the radial direction R, for example, and more specifically recessed from a face of the second main body portion 71 on the radially inner side R1 toward the radially outer side R2. The second groove portion 73 is provided to extend in the direction of extension of the second guide portion 70 (for example the axial direction Z). The lead wire portion 23 accommodated in the second groove portion 73 (in other words, the two wires 20*a*, 20*b*) is arranged to extend in the direction of extension of the second groove portion 73 (for example, the axial direction Z). The two wires 20*a*, 20*b* accommodated in the second groove portion 73 are in the lateral arrangement. The width direction of each of the two wires 20*a*, 20*b* accommodated in the second groove portion 73 is, for example, the circumferential direction C.

The second guide portion turn-back portion 75 is a portion where the lead wire portion 23 is turned back (makes a U-turn). The second guide portion turn-back portion 75 is a portion enabling the lead wire portion 23 to be held (stored) in the guide portion 50 even when the extra length of the lead wire portion 23 is large. More specifically, the second guide portion turn-back portion 75 arranges the lead wire portion 23 extending in a direction from the second guide portion base end 70*b* toward the second guide portion tip end 70*t* to be turned back in a direction from the second guide portion tip end 70*t* toward the second guide portion base end 70*b*. The "direction from the second guide portion base end 70*b* toward the second guide portion tip end 70*t*" is, specifically, a direction to the axially lower side Z2, or a direction to the substantially axially lower side Z2. The "direction from the second guide portion tip end 70*t* toward the second guide portion base end 70*b*" is, specifically, a direction to the axially upper side Z1, or a direction to the substantially axially upper side Z1. For example, the second guide portion turn-back portion 75 arranges the lead wire portion 23 extending to the axially lower side Z2 so as to be turned back to the axially upper side Z1. The second guide portion turn-back portion 75 is attached to the second main body portion 71. The second guide portion turn-back portion 75 is arranged on, for example, an inner side of the second groove portion 73 or the like.

The second guide portion turn-back portion 75 has such a shape that the lead wire portion 23 can be guided without being bent, as shown in FIG. 7. A specific example of the shape of the second guide portion turn-back portion 75 is similar to the first guide portion-curving portion 65, and is, for example, columnar (see FIG. 6). The number of the second guide portion turn-back portion 75 provided in one second guide portion 70 may be only one or greater than one. In a case of providing a plurality of second guide portion turn-back portions 75, there can be a plurality of options of the position where the lead wire portion 23 is turned back, whereby the extra length of the lead wire portion 23 can be stored with the smallest possible slack. The second guide portion turn-back portion 75 may be either rotatable with respect to the second main body portion 71 (for example a roller), or fixed to the second main body portion 71. As shown in FIG. 6, in the second guide portion turn-back portion 75, the two wires 20*a*, 20*b* are in the lateral arrangement, and arranged along the second guide portion turn-back portion 75 (for example, along the outer peripheral face of the second guide portion turn-back portion 75). The lead wire portion 23 turned back at the second guide portion turn-back portion 75 is arranged on the radially inner side R1 of the lead wire portion 23 before the turn (the lead wire portion 23 accommodated in the second groove portion 73).

The second connection portion-attaching portion 77 is a portion to which the connection portion 25*a* can be attached. The second connection portion-attaching portion 77 is a portion to which the connection portion 25*a* can be attached via the connection portion housing portion 31. Note that in a case of attaching the connection portion 25*a* to the first connection portion-attaching portion 67, the connection portion 25*a* is not required to be attached to the second connection portion-attaching portion 77. The second connection portion-attaching portion 77 is provided in the second main body portion 71. Specifically, for example, the second connection portion-attaching portion 77 is provided on a face on the radially inner side R1 of the second main body portion 71. The second connection portion-attaching portion 77 may be provided in only one position in the second main body portion 71. The second connection portion-attaching portion 77 may be provided in a plurality of positions in the second main body portion 71 and is provided in four positions in the example shown in FIG. 6, but may be provided in two, three, or more than five positions. In a case of providing the second connection portion-attaching portion 77 in a plurality of positions, the plurality of second connection portion-attaching portions 77 are arranged at intervals in the axial direction Z. For example, the second connection portion-attaching portion 77 is provided in both outward side portions in the circumferential direction C of the second groove portion 73. Specifically, for example, the second connection portion-attaching portion 77 includes a female screw.

The coupling portion 80 detachably attaches and fixes the second guide portion 70 to the first guide portion 60. The coupling portion 80 couples the first main body portion 61 and the second main body portion 71. For example, the coupling portion 80 couples the first guide portion tip end 60t and the second guide portion base end 70b. Specifically, for example, the coupling portion 80 includes a plate-like member 80a and a fastening member 80b. There are two plate-like members 80a provided. The two plate-like members 80a, 80a are arranged to interpose the first main body portion 61 and the second main body portion 71 therebetween in the circumferential direction C. The fastening member 80b fastens and fixes the plate-like member 80a to the first main body portion 61 and the second main body portion 71. Specifically, for example, the fastening member 80b is a member with a male screw, or the like.

The switch connection curving portion 91 guides the switch lead wires 35a, 35b, and the wires 20a, 20k extending from the bobbin-side guide portion 41 to be arranged in a curved state as shown in FIG. 5. The switch connection curving portion 91 is attached to, for example, the joint member 43. For example, there are two switch connection curving portions 91 provided, which are the switch connection curving portion 91 that guides the wire 20a and the switch lead wire 35a positioned at one end of the superconducting wires 20, and the switch connection curving portion 91 that guides the wire 20k and the switch lead wire 35b positioned at the other end of the superconducting wires 20. The number of the switch connection curving portion 91 may also be one, or greater than or equal to three. The switch connection curving portion 91 has such a shape that the lead wire portion 23 can be guided without being bent. Specifically, the switch connection curving portion 91 has an arc-shaped part seen in the axial direction Z, and, for example, is in a circular shape or the like seen in the axial direction Z. The switch connection curving portion 91 is, for example, columnar (see FIG. 2). The switch connection curving portion 91 may be either rotatable with respect to the joint member 43 (for example a roller), or fixed to the joint member 43. In the switch connection curving portion 91, the wire 20a and the switch lead wire 35a are in the lateral arrangement, and arranged along the switch connection curving portion 91 (for example, along the outer peripheral face of the switch connection curving portion 91) (the same applies to the wire 20b and the switch lead wire 35b). Note that in FIG. 5, the wires 20a, 20k, and the switch lead wires 35a, 35b are shown by chain double-dashed lines.

(Arrangement Operation of Superconducting Wires 20) A specific example of an arrangement operation of the superconducting wires 20 is as follows. As shown in FIG. 2, the lead wire portion 23 extending from the wound portion 21 is arranged in the bobbin-side guide portion 41 and the first guide portion 60 as described above. Herein, although the wires 20a, 20b shown in FIG. 6 are connected by the heat treatment as described above, the first superconducting coil 10A (see FIG. 2) cannot be placed entirely in a heating furnace. Consequently, it is required to draw only the wires 20a, 20b into the heating furnace, instead of the entire first superconducting coil 10A. Therefore, the wires 20a, 20b extend outward (for example, to the radially outer side R2) from the first guide portion 60 in a state in which the second guide portion 70 is removed from the first guide portion 60. The wires 20a, 20b extending from the first guide portion 60 are connected by the heat treatment to form the connection portion 25a. The connection portion 25a is stored in the connection portion housing portion 31. The wires 20a, 20b (lead wire portion 23) are curved by the first guide portion-curving portion 65, and the second guide portion 70 is attached and fixed to the first guide portion 60 by the coupling portion 80. The wires 20a, 20b are accommodated in the second groove portion 73 and turned back at the second guide portion turn-back portion 75. And then, the connection portion housing portion 31 is attached and fixed to the second connection portion-attaching portion 77.

As described above, the connection treatment of the connection portion 25a may or may not be redone once or a plurality of times. Therefore, the extra length of the lead wire portion 23 may vary. In addition, it is preferred that the extra length of the lead wire portion 23 is stored in the guide portion 50 with the smallest possible slack. Consequently, according to the extra length of the lead wire portion 23, an appropriate attachment position (of the connection portion housing portion 31) of the connection portion 25a is selected from the plurality of second connection portion-attaching portions 77. In addition, in accordance with the extra length of the lead wire portion 23, an appropriate turn-back position is selected from the plurality of second guide portion turn-back portions 75. Depending on the extra length of the lead wire portion 23, the connection portion 25a may be attached to the second guide portion 70 without turning back, at the second guide portion turn-back portion 75, the lead wire portion 23 extending from the first guide portion-curving portion 65 to the axially lower side Z2. In addition, depending on the extra length of the lead wire portion 23, the connection portion 25a may be attached to the first connection portion-attaching portion 67 without passing the lead wire portion 23 through the second guide portion 70. The lead wire portion 23 may be attached to the guide portion 50 and the bobbin-side guide portion 41 (see FIG. 2) (or reinforced) by, for example, an adhesive, a resin (for example, an epoxy resin), putty, a tape, wax, clay, or the like.

As shown in FIG. 2, a plurality of guide portions 50 are provided. The plurality of guide portions 50 are arranged at intervals in the circumferential direction C. More specifically, a portion of the first guide portion 60 on the radially outer side R2 and the second guide portion 70 are arranged at an interval in the circumferential direction C. The connection portion housing portions 31 (connection portions 25a to 25j) are held by the plurality of guide portions 50 respectively. As a result, the plurality of connection portions 25a to 25j are arranged at intervals in the circumferential direction C. In addition, the plurality of connection portions 25a to 25j can be arranged on the axially lower side Z2 of the first guide portion 60. Consequently, compared to the case of arranging the lead wire portions 23 and the plurality of connection portions 25a to 25j only in a plane including the first guide portion 60 and orthogonal to the axial direction Z, the turns of the lead wire portions 23 and the plurality of connection portions 25a to 25j can be arranged at intervals. In addition, the lead wire portion 23 can be arranged in an orderly manner.

The switch lead wires 35a, 35b and the wires 20a, 20k shown in FIG. 5 are connected to each other by the heat treatment to form the switch connection portion 37 (see FIG. 4). The switch connection portion 37 is stored in the switch connection portion housing portion 39. The wires connected by the switch connection portion 37 (for example the wire 20a and the switch lead wire 35a) are curved at the switch connection curving portion 91 and arranged to extend from the switch connection curving portion 91 to the radially inner side R1. The switch connection portion housing portion 39 is fixed to, for example, the joint member 43. The switch connection portion housing portion 39 is preferably arranged in such a position that the wires 20a, 20k have the smallest possible slack. In the example shown in FIG. 5, the switch connection portion housing portion 39 is arranged on the radially inner side R1 of the switch connection curving portion 91, the radially inner side R1 of the persistent-current switch 35, and the radially outer side R2 of the bobbin-side guide portion 41. In the example shown in FIG. 5, the switch lead wires 35a, 35b are in a slacked state, and fixed to the joint member 43, for example. Specifically, for example, the switch lead wires 35a, 35b are fixed to the joint member 43 by a resin. The resin is an epoxy resin and/or the like, for example, and is specifically, for example, an epoxy resin softened by adding ethanol prior to curing. Note that the cured epoxy resin is hard enough to appropriately fix the switch lead wires 35a, 35b to the joint member 43.

The wires 20a, 20k drawn from the bobbin-side guide portion 41 to the radially outer side R2 are fixed to, for example, the joint member 43, for example by a resin (similarly to fixation of the switch lead wires 35a, 35b to the joint member 43). In the case of fixing the wires 20a, 20k to the joint member 43, the position where the wires 20a, 20k are drawn from the bobbin side guide portion 41 is preferably as close as possible to the joint member 43 in the axial direction Z. In this case, the wires 20a, 20k can be fixed more reliably to the joint member 43.

The first guide portion 60 closest to the wire 20a and the switch connection portion 37 positioned at one end of the superconducting wires 20 is defined as an end first guide portion 60A. The end first guide portion 60A is preferably arranged such that a space can be secured for fixation of the wire 20a and the switch lead wire 35a to the joint member 43. In addition, the end first guide portion 60A is preferably arranged such that the fixation operation of the wire 20a and the switch lead wire 35a to the joint member 43 can be easily carried out. Specifically, as shown in FIG. 2, the end first guide portion 60A is preferably away from the joint member 43 in the axially lower side Z2. For example, the end first guide portion 60A is preferably fixed to the joint member 43 via the guide portion-fixing portion 45. For example, as shown in FIG. 3, while there are a plurality of types (for example, three levels) of the base end axial position P60b, the base end axial position P60b (see FIG. 3) of the end first guide portion 60A shown in FIG. 2 is preferably the base end axial position P60b most on the axially lower side Z2. The first guide portion 60 closest to the wire 20k and the switch connection portion 37 positioned at the other end of the superconducting wires 20 shown in FIG. 5 is also preferably arranged similarly to the end first guide portion 60A.

Effects of First Aspect of Invention

The effects of the superconducting coil device 1 shown in FIG. 1 are as follows. The superconducting coil device 1 includes, as shown in FIG. 2, the bobbin 11, the superconducting wires 20, the bobbin-side guide portion 41, the first guide portion 60, and the second guide portion 70. A part of the superconducting wires 20 constitutes the wound portion 21 where the superconducting wires are wound on the bobbin 11.

[Configuration 1-1] The bobbin-side guide portion 41 holds the superconducting wires 20 extending from the bobbin 11. The bobbin-side guide portion 41 is provided to extend in the axial direction Z of the bobbin 11 (bobbin axial direction).

[Configuration 1-2] The first guide portion 60 holds the superconducting wires 20 extending from the bobbin-side guide portion 41. The first guide portion 60 is arranged on the outer side of the bobbin-side guide portion 41 in the direction intersecting the axial direction Z (for example, on the radially outer side R2). The first guide portion 60 is provided to extend in the direction intersecting the axial direction Z (for example, in the radial direction R) (See FIG. 6).

[Configuration 1-3] As shown in FIG. 6, the second guide portion 70 can hold the superconducting wires 20 extending from the first guide portion 60. The second guide portion 70 is provided to extend in the direction intersecting the direction of extension of the first guide portion 60 (for example, the axial direction Z).

[Configuration 1-4] The connection portion 25a between the wires 20a, 20b constituting the superconducting wires 20 is fixed to at least either one of the first guide portion 60 and the second guide portion 70.

As shown in FIG. 2, the bobbin-side guide portion 41 of [Configuration 1-1] can hold the superconducting wires 20 in the position away from the bobbin 11 in the axial direction Z. The first guide portion 60 of [Configuration 1-2] can hold the superconducting wires 20 in the position away from the bobbin-side guide portion 41 on the outer side in the direction intersecting the axial direction Z (for example, the radially outer side R2) (See FIG. 6). As shown in FIG. 6, the second guide portion 70 of [Configuration 1-3] can arrange the superconducting wires 20 in the position away from the first guide portion 60 in the direction (for example, the axial direction Z) intersecting the direction of extension of the first guide portion 60. In addition, in [Configuration 1-4], the connection portion 25a is fixed to at least either one of the first guide portion 60 and the second guide portion 70. Therefore, the superconducting wires 20 including the connection portion 25a can be efficiently arranged in a limited space. For example, compared to the case of arranging the superconducting wires 20 only in a plane extending in the direction intersecting the axial direction Z, and including the first guide portion 60 (the case in which the second guide portion 70 cannot be provided), the superconducting wires 20 including the connection portion 25a can be arranged efficiently (for example, in an orderly manner). In addition, for example, even in the case in which the plurality of connection portions 25a to 25j are provided (see FIG. 4), the plurality of connection portions 25a to 25j, and the superconducting wires 20 (lead wire portion 23) extending from the plurality of connection portions 25a to 25j can be arranged efficiently (for example, in an orderly manner) in a limited space.

Effects of Second Aspect of Invention

[Configuration 2] The second guide portion 70 is detachably attached to the first guide portion 60.

Due to [Configuration 2] described above, operations (operation for the connection treatment and the like) for the superconducting wires 20 can be carried out in a state in which the second guide portion 70 is detached from the first guide portion 60. Workability of the operations can thus be improved.

Effects of Third Aspect of Invention

[Configuration 3] The guide portion 50 including the first guide portion 60 and the second guide portion 70 is provided with the plurality of connection portion-attaching portions (the first connection portion-attaching portion 67, the second connection portion-attaching portion 77) to which the connection portion 25a can be attached. The plurality of connection portion-attaching portions are provided on either one or both of the first guide portion 60 and the second guide portion 70.

In [Configuration 3] described above, there are a plurality of positions where the connection portion 25a can be attached to the guide portion 50. Consequently, the position of attachment of the connection portion 25a can be selected according to the length of the superconducting wires 20 (more specifically, the extra length). The connection portion 25a can thus be attached to the guide portion 50 with the smallest possible slack of the superconducting wires 20 held by the first guide portion 60 and the second guide portion 70.

Effects of Fourth Aspect of Invention

The end of the second guide portion 70 on the first guide portion 60 side is defined as the second guide portion base end 70b. The end of the second guide portion 70 on an opposite side to the first guide portion 60 side is defined as the second guide portion tip end 70t.

[Configuration 4] The second guide portion 70 includes the second guide portion turn-back portions 75. The second guide portion turn-back portion 75 can arrange the superconducting wires 20 extending in a direction from the second guide portion base end 70b toward the second guide portion tip end 70t to be turned back in a direction from the second guide portion tip end 70t toward the second guide portion base end 70b.

Due to [Configuration 4] described above, the superconducting wires 20 can be turned back at the second guide portion turn-back portion 75 even when the length (more specifically, the extra length) of the superconducting wires 20 held by the first guide portion 60 and the second guide portion 70 is large. The superconducting wires 20 can thus be held by the first guide portion 60 and the second guide 70 with the smallest possible slack of the superconducting wires 20.

Effects of Fifth Aspect of Invention

As shown in FIG. 3, the end of the first guide portion 60 on the bobbin-side guide portion 41 side is defined as the first guide portion base end 60b. A plurality of first guide portions 60 are provided.

[Configuration 5] The positions of the first guide portion base ends 60b (the base end axial positions P60b) of the plurality of first guide portions 60 in the axial direction Z are different from each other.

Due to [Configuration 5] described above, the superconducting wires 20 held by the first guide portion base ends 60b of the plurality of first guide portion 60 can be arranged in a state of being misaligned in the axial direction Z. Consequently, interference between the superconducting wires 20 held by the first guide portion base end 60b of the plurality of first guide portion 60 can be inhibited.

Due to [Configuration 5] described above, the first guide portion base ends 60b of the plurality of first guide portion 60 can be arranged in a state of being misaligned in the axial direction Z. Therefore, compared to the case in which the base end axial positions P60b of all the first guide portions 60 are the same (positions in the axial direction Z are the same), the number of the first guide portions 60 can be increased. As a result, the number of the connection portions 25a to 25j (see FIG. 4) can be increased.

Modifications

The above embodiment may be modified in various ways. For example, arrangement and shape of each constitutive element of the above embodiment may be changed. For example, the number of the constitutive elements may be changed, and a part of the constitutive elements may not be provided. For example, fixation and coupling of the constitutive elements may be either direct or indirect. For example, a plurality of different members and a plurality of different portions described above may be a single member and a single portion. For example, a single member and a single portion described above may be provided as a plurality of different members and a plurality of different portions.

In the above embodiment, in the superconducting coil device 1 shown in FIG. 1, the first superconducting coil 10A most on the radially inner side R1 has been described. On the other hand, the superconducting coil (such as the second superconducting coil 10B) on the radially outer side R2 of the first superconducting coil 10A may be provided with the guide device 40 and the like.

EXPLANATION OF THE REFERENCE SYMBOLS

1 Superconducting coil device
10A First superconducting coil
10B Second superconducting coil
10C Third superconducting coil
10D Fourth superconducting coil
10E Fifth superconducting coil
11 Bobbin
11a Bobbin center axis
11b Body
11c Flange portion
13 Circuit portion
20 Superconducting wires
20a, 20b, 20c, 20d, 20e, 20f, 20g, 20h, 20i, 20j, 20k Wire
20p Connecting material
21 Wound portion
23 Lead wire portion
25a, 25b, 25c, 25d, 25e, 25f, 25g, 25h, 25i, 25j Connection portion
31 Connection portion housing portion
31a First housing member
31b Second housing member
35 Persistent-current switch
35a, 35b Switch lead wire
37 Switch connection portion
39 Switch connection portion housing portion
40 Guide device
41 Bobbin-side guide portion
43 Joint member
45 Guide portion-fixing portion
50 Guide portion
60 First guide portion
60A End first guide portion
60b First guide portion base end
60t First guide portion tip end
61 First main body portion
62 Inclined portion
63 First groove portion
63a First groove portion base end side portion 63b First groove portion main body portion
65 First guide portion-curving portion
67 First connection portion-attaching portion (connection portion-attaching portion)
70 Second guide portion
70b Second guide portion base end
70t Second guide portion tip end
71 Second main body portion
73 Second groove portion
75 Second guide portion turn-back portion
77 Second connection portion-attaching portion (connection portion-attaching portion)
80 Coupling portion
80a Plate-like member
80b Fastening member
91 Switch connection curving portion
Z Axial direction (bobbin axial direction)
Z1 Axially upper side
Z2 Axially lower side
R Radial direction
R1 Radially inner side
R2 Radially outer side
C Circumferential direction
P60b Base end axial position
S Inner space (Cavity)

The invention claimed is:

1. A superconducting coil device comprising: a bobbin comprising a tubular body;
superconducting wires, a part of which constitutes a wound portion where the superconducting wires are wound on the bobbin;
a bobbin-side guide portion holding the superconducting wires extending from the bobbin, the bobbin-side guide portion being provided to extend in a bobbin axial direction, which is an axial direction of the body of the bobbin;
a first guide portion holding the superconducting wires extending from the bobbin-side guide portion, the first guide portion being arranged on an outer side of the bobbin-side guide portion in a direction intersecting the bobbin axial direction and provided to extend in the direction intersecting the bobbin axial direction; and
a second guide portion capable of holding the superconducting wires extending from the first guide portion, the second guide portion being provided to extend in a direction intersecting the direction of extension of the first guide portion,
wherein
the superconducting wires are constituted of a plurality of wires connected in series, and
a connection portion between the wires is fixed to at least either one of the first guide portion and the second guide portion.

2. The superconducting coil device according to claim 1, wherein
the second guide portion is detachably attached to the first guide portion.

3. The superconducting coil device according to claim 1, further comprising a plurality of connection portion-attaching portions to which the connection portion can be attached, wherein
the plurality of connection portion-attaching portions are provided on either one or both of the first guide portion and the second guide portion.

4. The superconducting coil device according to claim 1, wherein, when an end of the second guide portion on a first guide portion side is a second guide portion base end, and
an end of the second guide portion on an opposite side of the first guide portion side is a second guide portion tip end,
the second guide portion comprises a second guide portion turn-back portion that can arrange the superconducting wires extending from the second guide portion base end toward the second guide portion tip end to be turned back from the second guide portion tip end toward the second guide portion base end.

5. The superconducting coil device according to claim 1, wherein: the first guide portion is provided in a plurality of number;
an end of the first guide portion on a bobbin-side guide portion side is a first guide portion base end; and
positions of the first guide portion base ends of the plurality of first guide portions in the bobbin axial direction are different from each other.

6. The superconducting coil device according to claim 2, further comprising a plurality of connection portion-attaching portions to which the connection portion can be attached, wherein
the plurality of connection portion-attaching portions are provided on either one or both of the first guide portion and the second guide portion.

7. The superconducting coil device according to claim 2, wherein, when an end of the second guide portion on a first guide portion side is a second guide portion base end, and
an end of the second guide portion on an opposite side of the first guide portion side is a second guide portion tip end,
the second guide portion comprises a second guide portion turn-back portion that can arrange the superconducting wires extending from the second guide portion base end toward the second guide portion tip end to be turned back from the second guide portion tip end toward the second guide portion base end.

8. The superconducting coil device according to claim 2, wherein: the first guide portion is provided in a plurality of number;
an end of the first guide portion on a bobbin-side guide portion side is a first guide portion base end; and
positions of the first guide portion base ends of the plurality of first guide portions in the bobbin axial direction are different from each other.

* * * * *